(12) United States Patent
Lee et al.

(10) Patent No.: US 11,330,201 B2
(45) Date of Patent: May 10, 2022

(54) LIGHT SENSING CIRCUIT AND IMAGE SENSOR INCLUDING THE SAME

(71) Applicant: SAMSUNG ELECTRONICS CO., LTD., Suwon-si (KR)

(72) Inventors: Seungjoon Lee, Suwon-si (KR); Jungbin Yun, Suwon-si (KR); Younghwan Park, Suwon-si (KR); Jeongjin Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 130 days.

(21) Appl. No.: 16/670,216

(22) Filed: Oct. 31, 2019

(65) Prior Publication Data

US 2020/0336680 A1 Oct. 22, 2020

(30) Foreign Application Priority Data

Apr. 19, 2019 (KR) .................. 10-2019-0046082

(51) Int. Cl.
*H04N 5/335* (2011.01)
*H04N 5/343* (2011.01)
*H01L 27/146* (2006.01)

(52) U.S. Cl.
CPC ....... *H04N 5/343* (2013.01); *H01L 27/14621* (2013.01); *H01L 27/14627* (2013.01); *H01L 27/14641* (2013.01); *H01L 27/14645* (2013.01)

(58) Field of Classification Search
CPC .... H04N 5/343; H04N 5/347; H04N 5/37457; H01L 27/14645; H01L 27/14641; H01L 27/14627; H01L 27/14621
See application file for complete search history.

(56) References Cited

U.S. PATENT DOCUMENTS

| | | | |
|---|---|---|---|
| 8,446,498 B2 * | 5/2013 | Ishiwata | H01L 27/14645 348/273 |
| 8,947,567 B2 | 2/2015 | Suzuki et al. | |
| 9,426,384 B2 | 8/2016 | Bock | |
| 2014/0368680 A1 | 12/2014 | Ayers et al. | |
| 2015/0181142 A1 | 6/2015 | Lin et al. | |
| 2015/0358562 A1 * | 12/2015 | Egawa | H04N 5/343 348/250 |
| 2016/0165159 A1 | 6/2016 | Hseih et al. | |
| 2016/0204159 A1 | 7/2016 | Wakano et al. | |
| 2017/0302836 A1 | 10/2017 | Okura et al. | |
| 2018/0054580 A1 | 2/2018 | Adachi et al. | |
| 2018/0205897 A1 | 7/2018 | Kim et al. | |
| 2018/0324371 A1 | 11/2018 | Sano et al. | |

\* cited by examiner

*Primary Examiner* — Kelly L Jerabek

(74) *Attorney, Agent, or Firm* — Lee IP Law, PC

(57) ABSTRACT

A light sensing circuit and an image sensor are provided. The image sensor includes a first pixel unit including a plurality of first photodiodes and a first driving circuit to generate a first pixel signal based on an amount of charges stored in the plurality of first photodiodes, a second pixel unit including a plurality of second photodiodes and a second driving circuit to generate a second pixel signal based on an amount of charges stored in the plurality of second photodiodes, and a switching circuit connected to the first driving circuit through a first diffusion node and connected to the second driving circuit through a second diffusion node. The switching circuit connects or disconnects the first diffusion node and the second diffusion node based on a mode selection signal.

17 Claims, 12 Drawing Sheets

LIGHT SENSING CIRCUIT AND IMAGE SENSOR INCLUDING THE SAME

CROSS-REFERENCE TO RELATED APPLICATION

Korean Patent Application No. 10-2019-0046082, filed on Apr. 19, 2019, in the Korean Intellectual Property Office, and entitled: "Light Sensing Circuit and Image Sensor Including the Same," is incorporated by reference herein in its entirety.

BACKGROUND

1. Field

Embodiments relate to an image sensor, and more particularly, to an image sensor to obtain pixel data from a different number of photodiodes according to a mode.

2. Description of the Related Art

An image sensor may convert a light signal including image information about a subject into an electric signal. Charge-coupled device (CCD) image sensors and complementary metal-oxide semiconductor (CMOS) image sensors have widely been used as image sensors. In recent years, with the developments of the computer industry and the communication industry, the demand for image sensors having improved performance has increased in various electronic devices, e.g., as digital cameras, camcorders, personal communication systems (PCSs), game consoles, surveillance cameras, medical micro-cameras, portable phones, and the like.

SUMMARY

According to an aspect, an image sensor may include a first pixel unit including a plurality of first photodiodes and a first driving circuit to generate a first pixel signal based on an amount of charges stored in the plurality of first photodiodes, a second pixel unit including a plurality of second photodiodes and a second driving circuit to a second pixel signal based on an amount of charges stored in the plurality of second photodiodes, and a switching circuit connected to the first driving circuit through a first diffusion node and connected to the second driving circuit through a second diffusion node, the switching circuit to connect or disconnect the first diffusion node and the second diffusion node based on a mode selection signal.

According to another aspect, a light sensing circuit may include a plurality of first photodiodes to store charges based on optical information received through a first color filter in a first color, a first driving circuit to change a voltage of a first diffusion node based on an amount of charges stored in the plurality of first photodiodes, a plurality of second photodiodes to store charges based on optical information received through a second color filter in a second color, a second driving circuit to change a voltage of a second diffusion node based on an amount of charges stored in the plurality of second photodiodes, and a switching circuit to connect or disconnect the first diffusion node and the second diffusion node based on a mode selection signal.

According to another aspect, an image sensor may include a first pixel unit including a plurality of first photodiodes to receive light through a first color filter of a first color, a second pixel unit including a plurality of second photodiodes to receive light through a second color filter of a second color, different from the first color, a first unit microlens on the first pixel unit, and a second unit microlens on the second pixel unit. The plurality of first photodiodes share at least some of charges stored therein with each other.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
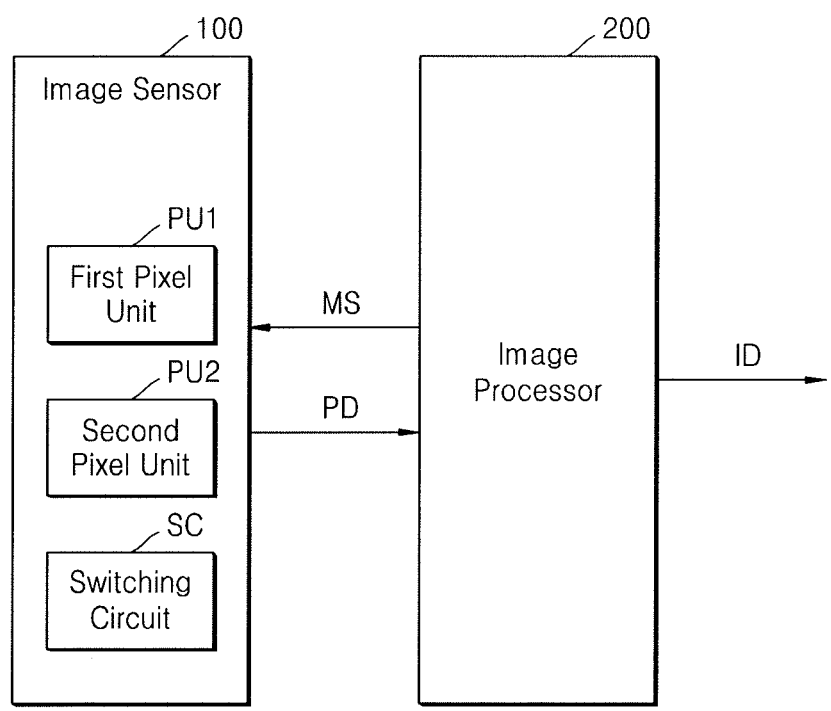
FIG. 1 illustrates an image processing device according to an example embodiment.

FIG. 1 illustrates an image processing device 10 according to an example embodiment. Referring to FIG. 1, the image processing device 10 may include an image processor 200 and an image sensor 100, and the image sensor 100 may include a first pixel unit PU1, a second pixel unit PU2, and a switching circuit SC. The image sensor 100 may sense the intensity of light of an object of which an image has been captured through a lens, via the control of the image processor 200, change the sensed intensity of light into pixel data PD of a digital type, and output the pixel data PD to the image processor 200.

Each of the first pixel unit PU1 and the second pixel unit PU2 may include a plurality of photodiodes having color filters in different colors and a driving circuit to generate pixel data PD using photocharges stored in the plurality of photodiodes. In an embodiment, each of the first pixel unit PU1 and the second pixel unit PU2 may include a tetra cell including a plurality of photodiodes including a color filter in one color, as described in detail with reference to FIG. 3.

The switching circuit SC may include at least one switching element that switches between the first pixel unit PU1 and the second pixel unit PU2. According to an example embodiment, the switching circuit SC may receive a mode signal MS from a controller of the image processor 200 or the image sensor 100 and switch between the first pixel unit PU1 and the second pixel unit PU2 based on the mode signal MS.

In a first mode, the switching circuit SC may electrically connect the first pixel unit PU1 to the second pixel unit PU2.

Thus, one piece of pixel data PD may be output by the first pixel unit PU1 and the second pixel unit PU2. In an example, the switching circuit SC may connect the first pixel unit PU1 to the second pixel unit PU2 according to the first mode in a low-luminance environment, and the first pixel unit PU1 and the second pixel unit PU2 may output one piece of pixel data PD to the image processor 200. In another example, when a user requires a low resolution, the switching circuit SC may connect the first pixel unit PU1 to the second pixel unit PU2 according to the first mode, and the first pixel unit PU1 and the second pixel unit PU2 may output one piece of pixel data PD to the image processor 200.

In a second mode, the switching circuit SC may electrically isolate the first pixel unit PU1 from the second pixel unit PU2. Thus, a plurality of pieces of pixel data PD may be output by the first pixel unit PU1 and the second pixel unit PU2. In an example, the switching circuit SC may isolate the first pixel unit PU1 from the second pixel unit PU2 according to the second mode in a high-luminance environment, and the first pixel unit PU1 and the second pixel unit PU2 may output a plurality of pieces of pixel data PD to the image processor 200. In another example, when a user requires a high resolution, the switching circuit SC may isolate the first pixel unit PU1 from the second pixel unit PU2 according to the second mode, and the first pixel unit PU1 and the second pixel unit PU2 may output a plurality of pieces of pixel data PD to the image processor 200.

The image processor 200 may process the pixel data PD, which is sensed and output by the image sensor 100 to be viewed by the human eye and output the processed image data ID to a display device. The display device may include a device (e.g., a computer, a portable phone, any electronic device including a camera, and the like) capable of outputting an image. In an example, the image processor 200 may be implemented as any one of a digital signal processor (DSP), an image signal processor (ISP), an application processor (AP), and the like.

The image processor 200 may receive a mode command from a user or a host and output a mode selection signal MS to the image sensor 100 based on the mode command. In an example, the mode selection signal MS may include a first mode signal corresponding to low luminance and a second mode signal corresponding to high luminance. In another example, the mode selection signal MS may include a first mode signal corresponding to low resolution and a second mode signal corresponding to high resolution. FIG. 1 illustrates an embodiment in which the image processor 200 outputs the mode selection signal MS to the image sensor 100. In an implementation, the mode selection signal MS may be generated by a controller of the image sensor 100.

Figure 2:
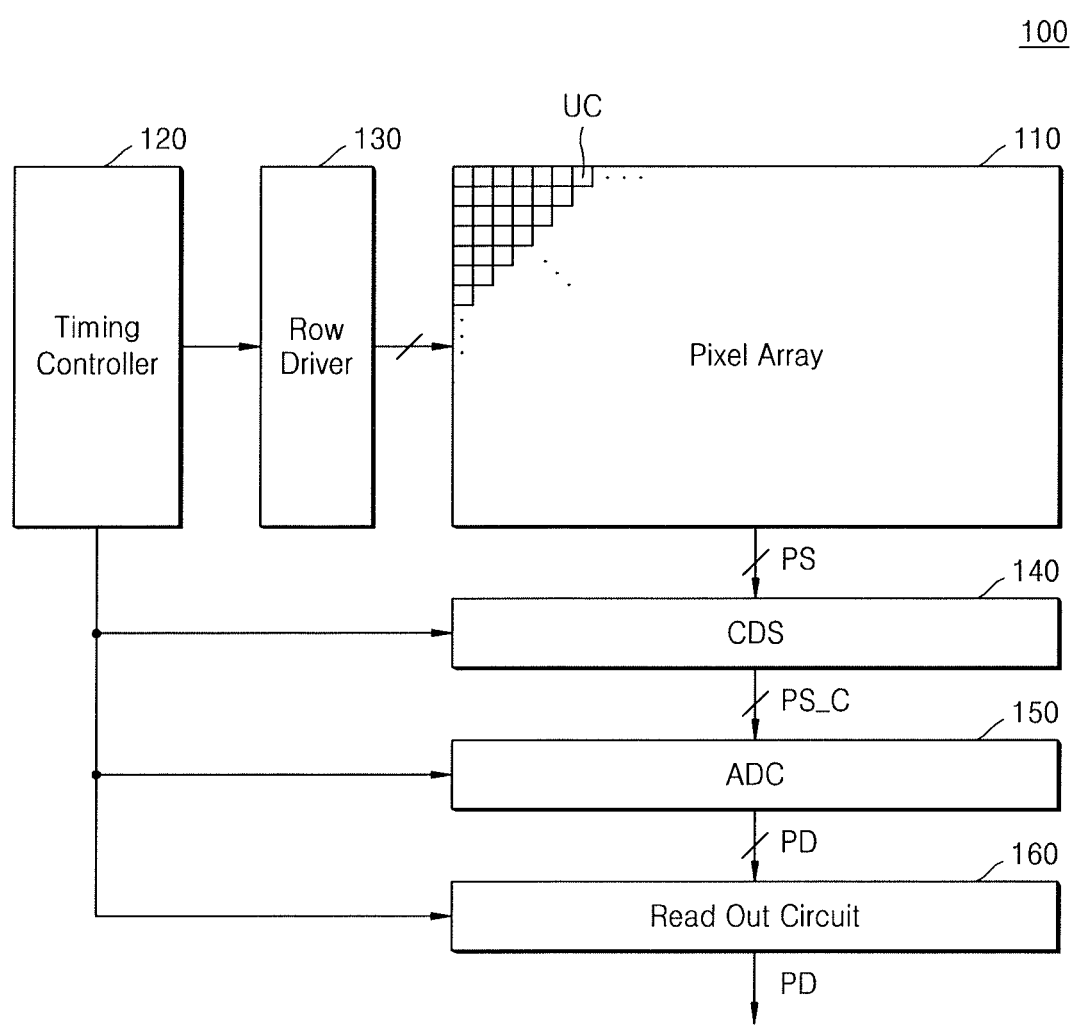
FIG. 2 illustrates an image sensor according to an example embodiment.

FIG. 2 illustrates an image sensor 100 according to an example embodiment. Referring to FIG. 2, the image sensor 100 may include a pixel array 110, a timing controller 120, a row driver 130, a correlated double sampling (CDS) unit 140, an analog-to-digital converter (ADC) 150, and a readout circuit 160.

The pixel array 110 may include a plurality of unit cells UC and a plurality of switching circuits (refer to SC in FIG. 1). The pixel array 110 may generate a plurality of pixel signals PS of an analog domain, based on a light signal including image information about a subject. To this end, the pixel array 110 may include a plurality of photoelectric conversion elements, e.g., photodiodes, pinned photodiodes, and the like, and a plurality of unit cells UC arranged in rows and columns. The pixel array 110 may sense light using the plurality of photoelectric conversion elements, convert the light into an electric signal, and generate a pixel signal PS.

The pixel array 110 may output a pixel signal PS including a reset control signal and an image signal from a row line, selected in response to a row selection control signal provided by the row driver 130, to the CDS unit 140.

The pixel array 110 may include a plurality of pixel units, which are arranged in a matrix and respectively connected to a plurality of row lines and a plurality of column lines, and at least some of the pixel units may constitute one unit cell UC. The pixel array 110 may be formed by vertically stacking a semiconductor substrate, an interlayer insulating layer, a color filter layer, and microlenses. For example, the semiconductor substrate may be a semiconductor substrate obtained by forming a p-type epitaxial layer on a p-type bulk silicon substrate, and a photodiode may be formed by implanting n-type ions into the p-type epitaxial layer.

An interlayer insulating layer may be stacked on the semiconductor substrate. The interlayer insulating layer may include gates of transistors included in a unit pixel and a multi-layered conductive line. In some embodiments, a protective layer may be stacked on the interlayer insulating layer. The color filter layer may be stacked on the interlayer insulating layer (or the protective layer). The color filter layer may include a plurality of color filters. The color filters may include at least one red filter, at least one green filter, and at least one blue filter. Alternatively, the color filters may include at least one magenta filter, at least one cyan filter, and at least one yellow filter. In some embodiments, a planarization layer, e.g., an over-coating layer, may be stacked on the color filter layer. The microlenses may be stacked on the color filter layer (or the planarization layer). The microlenses may focus incident light to be efficiently provided to photodiodes of a unit cell UC.

Each of the plurality of unit cells UC may include a red pixel to convert light in a red spectral range into an electric signal, a green pixel to convert light in a green spectral range into an electric signal, and a blue pixel to convert light in a blue spectral range into an electric signal. According to an example embodiment, each of the plurality of unit cells UC may be implemented as a tetra cell including a first pixel unit including a plurality of red pixels, a second pixel unit and a third pixel unit each including a plurality of green pixels, and a fourth pixel unit including a plurality of blue pixels, as described in detail with reference to FIG. 3.

The row driver 130 may be connected to each row of the pixel array 110 and generate a driving signal to drive each row. The row driver 130 may drive pixel units included in the plurality of unit cells UC included in the pixel array 110 or pixels included in the pixel units on a row basis. For example, the row driver 130 may generate a transfer control signal for controlling transfer transistors of each pixel unit included in the pixel array 110, a reset control signal for controlling a reset transistor of each pixel unit, and a selection control signal for controlling a selection transistor of each pixel unit.

The CDS unit 140 may perform a CDS operation on the plurality of pixel signals PS generated by the pixel array 110 and generate a plurality of CDS signals PS_C. For example, the CDS unit 140 may perform the CDS operation by obtaining a difference between an analog reset control signal indicating a reset component of analog pixel signals and an analog data signal indicating an image component and an ambient light component of the analog pixel signals and output CDS signals PS_C corresponding to a valid signal component. The CDS unit 140 may include a plurality of CDS circuits respectively connected to column lines of the pixel array 110. The CDS unit 140 may output the CDS signals PS_C corresponding to the valid signal component for each column.

The ADC 150 may perform an analog-to-digital conversion (ADC) operation on the CDS signals PS_C and generate pixel data PD. The ADC 150 may include a counter and a comparator. The counter and the comparator may perform a counting operation on the analog reset control signal and the analog data signal, generate the pixel data PD, and provide the pixel data PD to the readout circuit 160.

The readout circuit 160 may include a plurality of memories. Each of the memories may store the pixel data PD received from the ADC 150 based on a control signal generated by the timing controller 120. Each of the plurality of memories may be a volatile memory, e.g., static random access memory (SRAM). The readout circuit 160 may output pixel data PD of a digital domain to an image processor.

The timing controller 120 may control the row driver 130, the CDS unit 140, and the ADC 150. The timing controller 120 may supply clock signals required for operations of the row driver 130, the CDS unit 140, and the ADC 150 and control signals, e.g., timing control signals. In an embodiment, the timing controller 120 may include a logic control circuit, a phase locked loop (PLL) circuit, a timing control circuit, and a communication interface circuit.

The image sensor 100 may further include a voltage generator to generate various driving voltages, such as a reference voltage and a ramp voltage. FIG. 1 illustrates an example in which the image sensor 100 performs an analog double sampling operation. However, in an implementation, the image sensor 100 may convert the analog reset control signal and the analog data signal into digital signals, respectively, and perform a digital double sampling operation of extracting a difference between two digital signals as the valid signal component or perform a dual CDS operation to perform both the analog double sampling operation and the digital double sampling operation.

Figure 3:
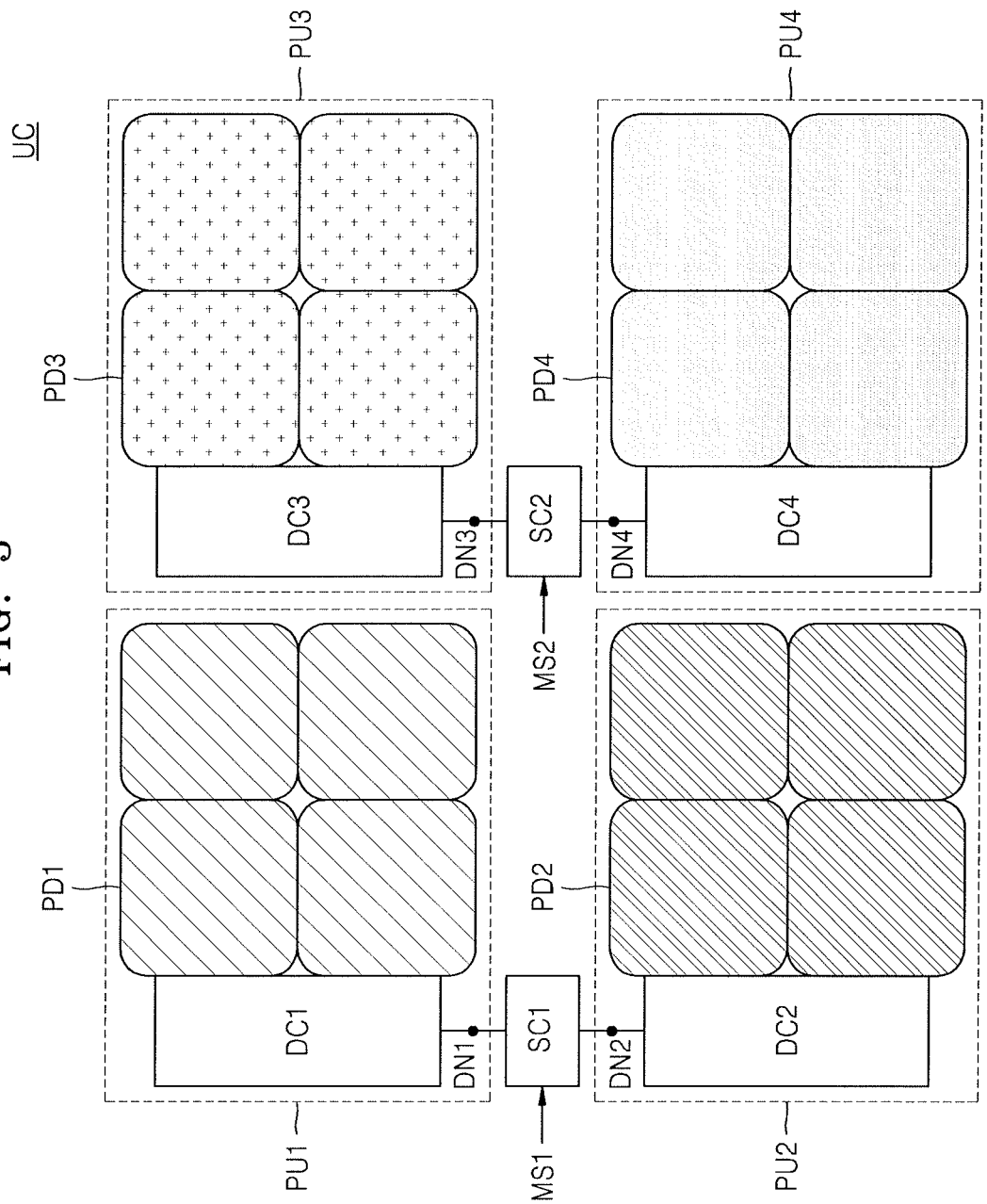
FIG. 3 illustrates a unit cell according to an example embodiment.

FIG. 3 is a diagram of a unit cell UC according to an example embodiment. Referring to FIG. 3, the unit cell UC may include first to fourth pixel units PU1 to PU4, a first switching circuit SC1, and a second switching circuit SC2.

The first pixel unit PU1 may include a plurality of first photodiodes PD1 and a first driving circuit DC1 connected to the first switching circuit SC1 through a first diffusion node DN1. The plurality of first photodiodes PD1 may receive optical information through a color filter corresponding to a first color and change the optical information into photocharges. The first driving circuit DC1 may output photocharges collected by the plurality of first photodiodes PD1 as a first pixel signal through the first diffusion node DN1.

The second pixel unit PU2 may include a plurality of second photodiodes PD2 and a second driving circuit DC2 connected to the first switching circuit SC1 through a second diffusion node DN2. The plurality of second photodiodes PD2 may receive optical information through a color filter corresponding to a second color and change the optical information into photocharges. The second driving circuit DC2 may output photocharges collected by the plurality of second photodiodes PD2 as a second pixel signal through the second diffusion node DN2.

The first switching circuit SC1 may switch between the first diffusion node DN1 and the second diffusion node DN2 based on a first mode selection signal MS1. In a first mode, the first switching circuit SC1 may electrically connect the first diffusion node DN1 to the second diffusion node DN2.

Accordingly, the first switching circuit SC1 may output one pixel signal corresponding to photocharges collected by the plurality of first photodiodes PD1 and the plurality of second photodiodes PD2. In a second mode, the first switching circuit SC1 may electrically isolate the first diffusion node DN1 from the second diffusion node DN2. Thus, the first pixel signal and the second pixel signal may be independently output through the first and second diffusion nodes DN1 and DN2, respectively.

A third pixel unit PU3 may include a plurality of third photodiodes PD3 and a third driving circuit DC3 connected to the second switching circuit SC2 through a third diffusion node DN3. The plurality of third photodiodes PD3 may receive optical information through a color filter corresponding to a third color and change the optical information into photocharges. The third driving circuit DC3 may output photocharges collected by the plurality of third photodiodes PD3 as a third pixel signal through the third diffusion node DN3.

The fourth pixel unit PU4 may include a plurality of fourth photodiodes PD4 and a fourth driving circuit DC4 connected to the second switching circuit SC2 through a fourth diffusion node DN4. The plurality of fourth photodiodes PD4 may receive optical information through a color filter corresponding to a fourth color and change the optical information into photocharges. The fourth driving circuit DC4 may output photocharges collected by the plurality of fourth photodiodes PD4 as a fourth pixel signal through the fourth diffusion node DN4.

The second switching circuit SC2 may switch between the third diffusion node DN3 and the fourth diffusion node DN4 based on a second mode selection signal MS2. In the first mode, the second switching circuit SC2 may electrically connect the third diffusion node DN3 to the fourth diffusion node DN4 and thus, output one pixel signal corresponding to photocharges collected by the plurality of third photodiodes PD3 and the plurality of fourth photodiodes PD4. In the second mode, the second switching circuit SC2 may electrically isolate the third diffusion node DN3 from the fourth diffusion node DN4. Thus, the third pixel signal and the fourth pixel signal may be independently output through the third and fourth diffusion nodes DN3 and DN4, respectively.

According to the example embodiment, in the first mode, the first pixel unit PU1 and the second pixel unit PU2 may operate simultaneously, and the third pixel unit PU3 and the fourth pixel unit PU4 may operate simultaneously, so that pixel data may be generated using relatively many photocharges. Accordingly, the pixel data may be effectively generated even at a low luminance. In the second mode, the first pixel unit PU1 and the second pixel unit PU2 may operate independently from each other, and the third pixel unit PU3 and the fourth pixel unit PU4 may operate independently from each other. Thus, individual pixel data may generate high-resolution pixel data.

In an embodiment, each of the first color corresponding to the first photodiode PD1, the second color corresponding to the second photodiode PD2, the third color corresponding to the third photodiode PD3, and the fourth color corresponding to the fourth photodiode PD4 may include any one of red, green, and blue. In an example, the first color may include blue, each of the second color and the third color may include green, and the fourth color may include red.

Although the first to fourth pixel units PU1 to PU4 are illustrated apart from each other in FIG. 3 for brevity, the plurality of photodiodes PD1 to PD4 may be arranged at regular intervals from each other in a lattice form, and the plurality of driving circuits DC1 to DC4 may be located in a separate layer from the plurality of photodiodes PD1 to PD4.

FIG. 3 illustrates an embodiment in which the first mode signal MS1 and the second mode signal MS2 are received independently from each other. In an implementation, and the first mode signal MS1 and the second mode signal MS2 may be received as the same signal.

Figure 4A:
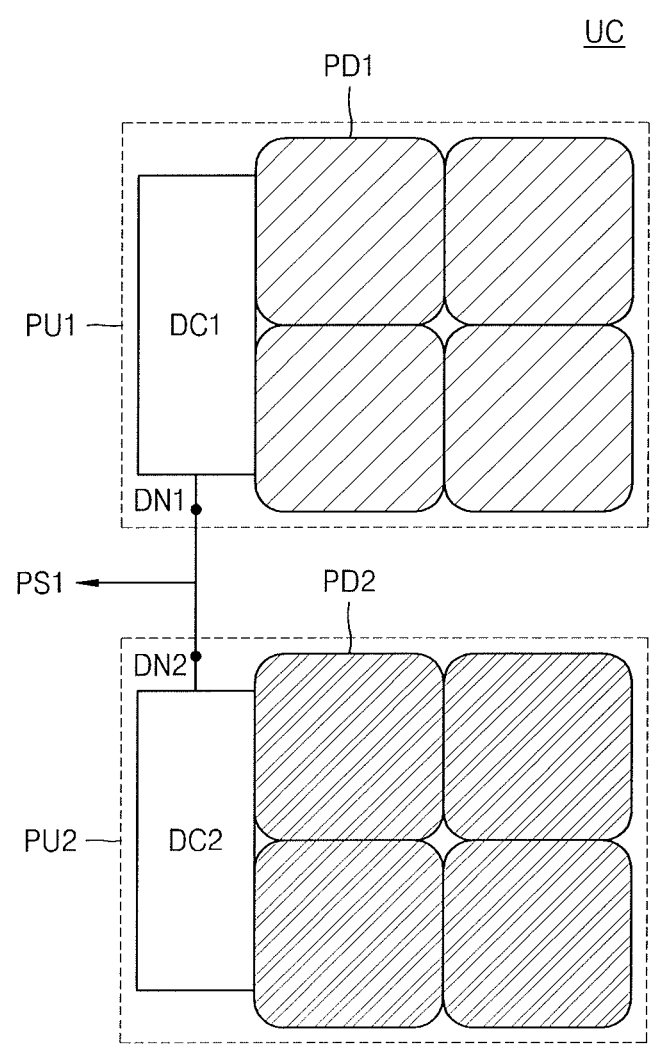
FIGS. 4A and 4B illustrate diagrams of unit cells according to an example embodiment.
Figure 4B:
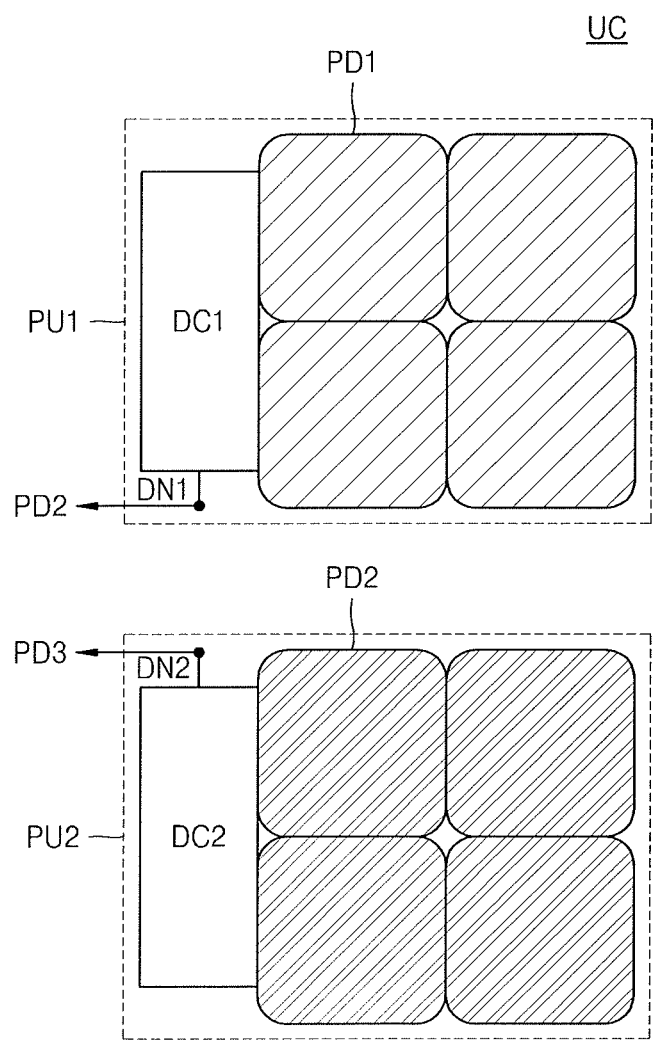

FIGS. 4A and 4B are diagrams of a unit cell according to an example embodiment. Specifically, FIG. 4A illustrates operations of the first pixel unit PU1 and the second pixel unit PU2 in a first mode, and FIG. 4B illustrates operations of the first pixel unit PU1 and the second pixel unit PU2 in a second mode.

Referring to FIGS. 3 and 4A, the first driving circuit DC1 may change a voltage of a first diffusion node DN1 based on photocharges generated by a plurality of first photodiodes PD1 and the second driving circuit DC2 may change a voltage of a second diffusion node DN2 based on photocharges generated by a plurality of second photodiodes PD2. In the first mode, since the first switching circuit SC1 electrically connects the first diffusion node DN1 to the second diffusion node DN2, charges may be shared between the first diffusion node DN1 and the second diffusion node DN2, thereby generating one first pixel signal PS1.

Referring to FIG. 4B, in the second mode, since the first switching circuit SC1 electrically isolates the first diffusion node DN1 from the second diffusion node DN2, a second pixel signal PD2 based on a voltage level of the first diffusion node DN1 may be generated independently from a third pixel signal PD3 based on a voltage level of the second diffusion node DN2.

Although a third pixel unit PU3 and a fourth pixel unit PU4 are not illustrated in FIGS. 4A and 4B for brevity, operations of the third pixel unit PU3 and the fourth pixel unit PU4 may be the same as or similar to those of the first pixel unit PU1 and the second pixel unit PU2.

Figure 5:
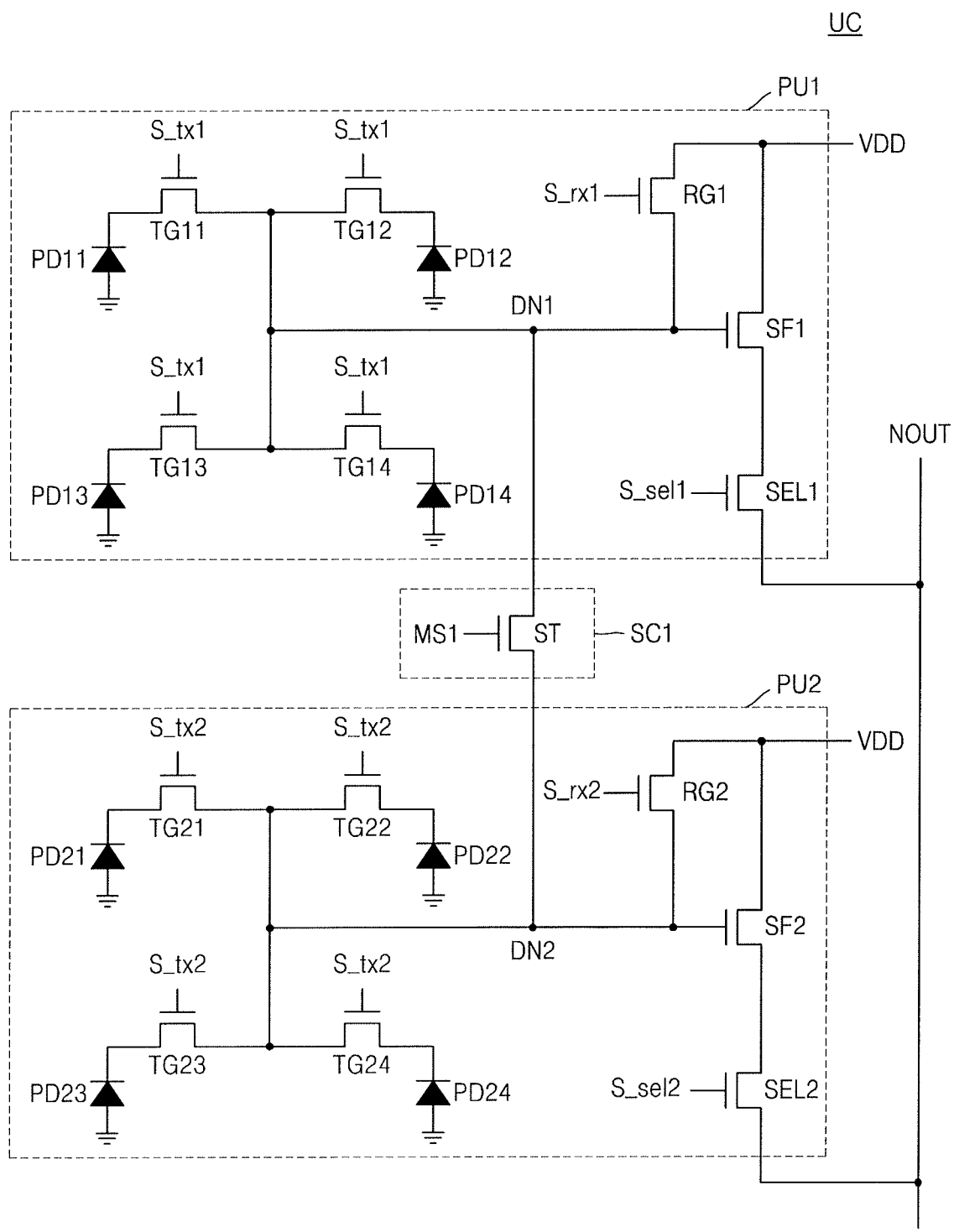
FIG. 5 illustrates a circuit diagram of a unit cell according to an example embodiment.

FIG. 5 is a circuit diagram of a unit cell UC according to an example embodiment. Referring to FIG. 5, the unit cell UC may include the first pixel unit PU1, the second pixel unit PU2, and the first switching circuit SC1.

The first pixel unit PU1 may include a plurality of first photodiodes (e.g., PD11 to PD14), a plurality of first transfer transistors (e.g., TG11 to TG14), a first driving transistor SF1, a first selection transistor SEL1, and a first reset transistor RG1. The first transfer transistors TG11 to TG14 may be respectively connected between the first photodiodes PD11 to PD14 corresponding thereto and a first diffusion node DN1, and transmit photocharges accumulated in the first photodiodes PD11 to PD14 to the first diffusion node DN1 based on a first transfer control signal S_tx1.

The first diffusion node DN1 may collect photocharges accumulated in the first photodiodes PD11 to PD14 and may be referred to as a floating diffusion area. The first transfer transistors TG11 to TG14 may operate independently from each other or simultaneously. In an example, only some of the first transfer transistors TG11 to TG14 may be turned on based on the first transfer control signal S_tx1, and thus, only photocharges accumulated in some of the first photodiodes PD11 to PD14 may be transmitted to the first diffusion node DN1.

The first driving transistor SF1 may have a gate connected to the first diffusion node DN1 and apply a power supply voltage VDD to an output node NOUT based on a voltage of the first diffusion node DN1. The first reset transistor RG1 may reset a voltage level of the first diffusion node DN1 to the power supply voltage VDD based on a first reset control signal S_rx1. The first selection transistor SEL1 may output a signal received from the first driving transistor SF1, as a pixel signal, to the output node NOUT based on a first selection control signal S_sel1. In an example, the output node NOUT may be connected to a column line of a pixel array.

The second pixel unit PU2 may include a plurality of second photodiodes (e.g., PD21 to PD24), a plurality of second transfer transistors (e.g., TG21 to TG24), a second driving transistor SF2, a second selection transistor SEL2, and a second reset transistor RG2. Operations of the second pixel unit PU2 may be the same as or similar to those of the first pixel unit PU1, and thus, a description thereof will not be repeated.

The first switching circuit SC1 may include a switching transistor ST connected between the first diffusion node DN1 and the second diffusion node DN2. The switching transistor ST may switch the first diffusion node DN1 and the second diffusion node DN2 based on a first mode selection signal MS1.

In the first mode, the switching transistor ST may be turned on and, thus, the first diffusion node DN1 and the second diffusion node DN2 may be shorted. Also, charge sharing may occur to share photocharges from the plurality of first photodiodes PD11 to PD14 to the first diffusion node DN1 and photocharges from the plurality of second photodiodes PD21 to PD24 to the second diffusion node DN2. Accordingly, the first driving transistor SF1 and the second driving transistor SF2 may be driven simultaneously, and one pixel signal may be output through the output node NOUT to a column line.

In the second mode, the switching transistor ST may be turned off, and thus, the first diffusion node DN1 and the second diffusion node DN2 may be opened. Also, the first driving transistor SF1 and the second driving transistor SF2 may be independently driven based on the photocharges from the plurality of first photodiodes PD11 to PD14 to the first diffusion node DN1 and the photocharges from the plurality of second photodiodes PD21 to PD24 to the second diffusion node DN2. Accordingly, a first pixel signal based on the plurality of first photodiodes PD11 to PD14 and a second pixel signal based on the plurality of second photodiodes PD21 to PD24 may be independently output through the output node NOUT.

Figure 6:
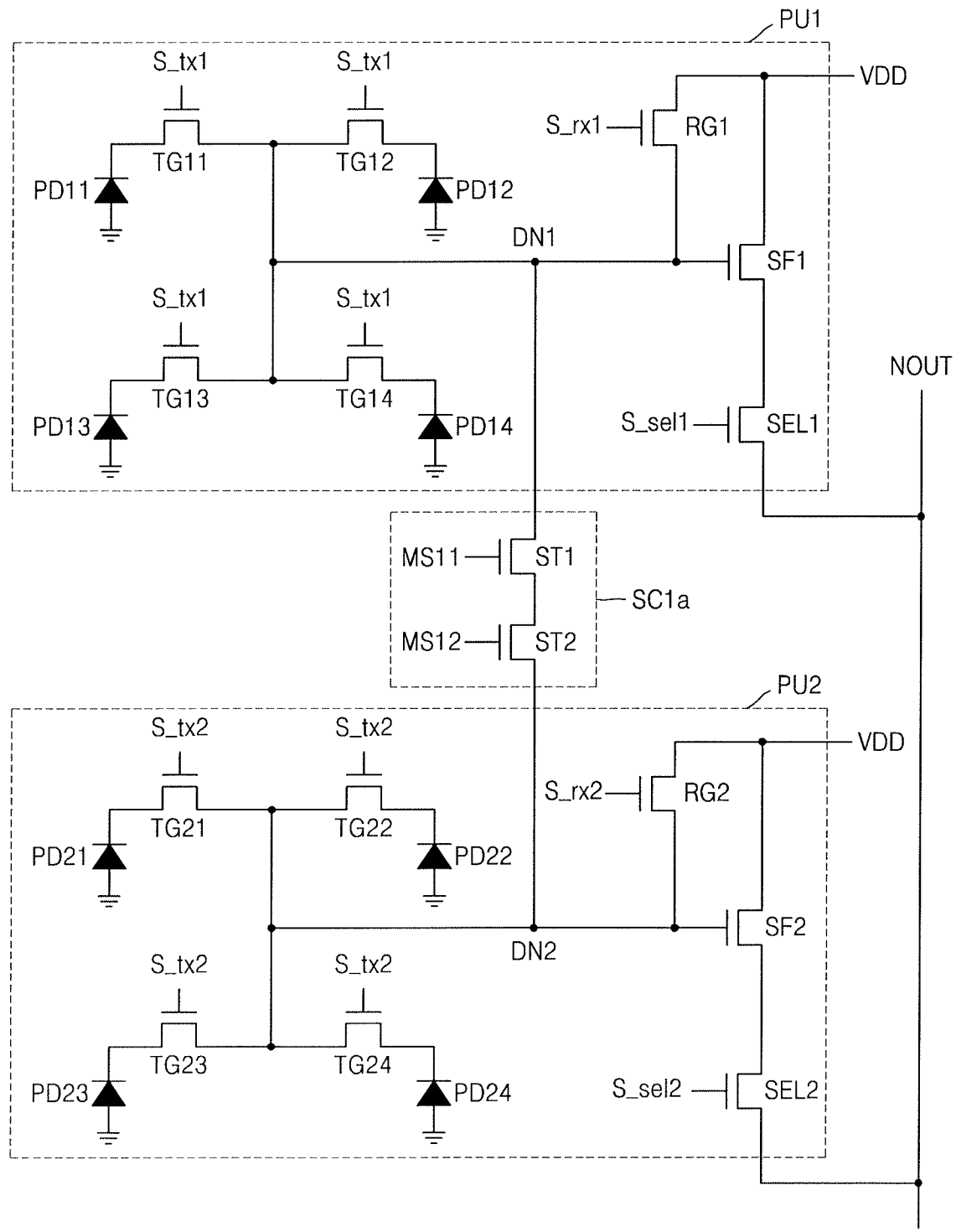
FIG. 6 illustrates a circuit diagram of a unit cell according to an example embodiment.

FIG. 6 is a circuit diagram of a unit cell UCa according to an example embodiment. The same description as given with reference to FIG. 5 will not be repeated.

Referring to FIG. 6, the unit cell UCa may include the first pixel unit PU1, the second pixel unit PU2, and a first switching circuit SC1a. Since the first pixel unit PU1 and the second pixel unit PU2 have been described above with reference to FIG. 5, a description thereof will not be repeated.

The first switching circuit SC1a may include a first switching transistor ST1 and a second switching transistor ST2, which are connected in series. The first switching transistor ST1 and the second switching transistor ST2 may operate independently from each other based on a first mode selection signal MS11 and a second mode selection signal MS12. Since the first switching circuit SC1a includes a plurality of switching transistors (e.g., the first and second switching transistors ST1 and ST2) connected in series, an extent to which charges are shared between a first diffusing node DN1 and a second diffusing node DN2 may be adjusted.

In a first mode, both the first switching transistor ST1 and the second switching transistor ST2 may be turned on. Thus, a first pixel signal generated by the first pixel unit PU1 may be equal to a second pixel signal generated by the second pixel unit PU2.

In a second mode, both the first switching transistor ST1 and the second switching transistor ST2 may be turned off. Thus, the first pixel signal generated by the first pixel unit PU1 may be different from the second pixel signal generated by the second pixel unit PU2.

In a third mode, the first switching transistor ST1 may be turned on and the second switching transistor ST2 may be turned off. Thus, only some photocharges of the first diffusing node DN1 may be transmitted to the second diffusing node DN2. As a result, the first pixel signal generated by the first pixel unit PU1 and the second pixel signal generated by the second pixel unit PU2 may be different but may be interpolated with each other. To this end, in an embodiment, the first switching transistor ST1 may include a transistor having a large size, while the second switching transistor ST2 may include a transistor having a small size, i.e., may have a faster switching speed than the first switching transistor ST1.

FIG. 6 illustrates an embodiment in which the first switching circuit SC1a includes two switching transistors, i.e., the first and second switching transistors ST1 and ST2. In an implementation, the first switching circuit SC1a may include three or more switching transistors.

Figure 7:
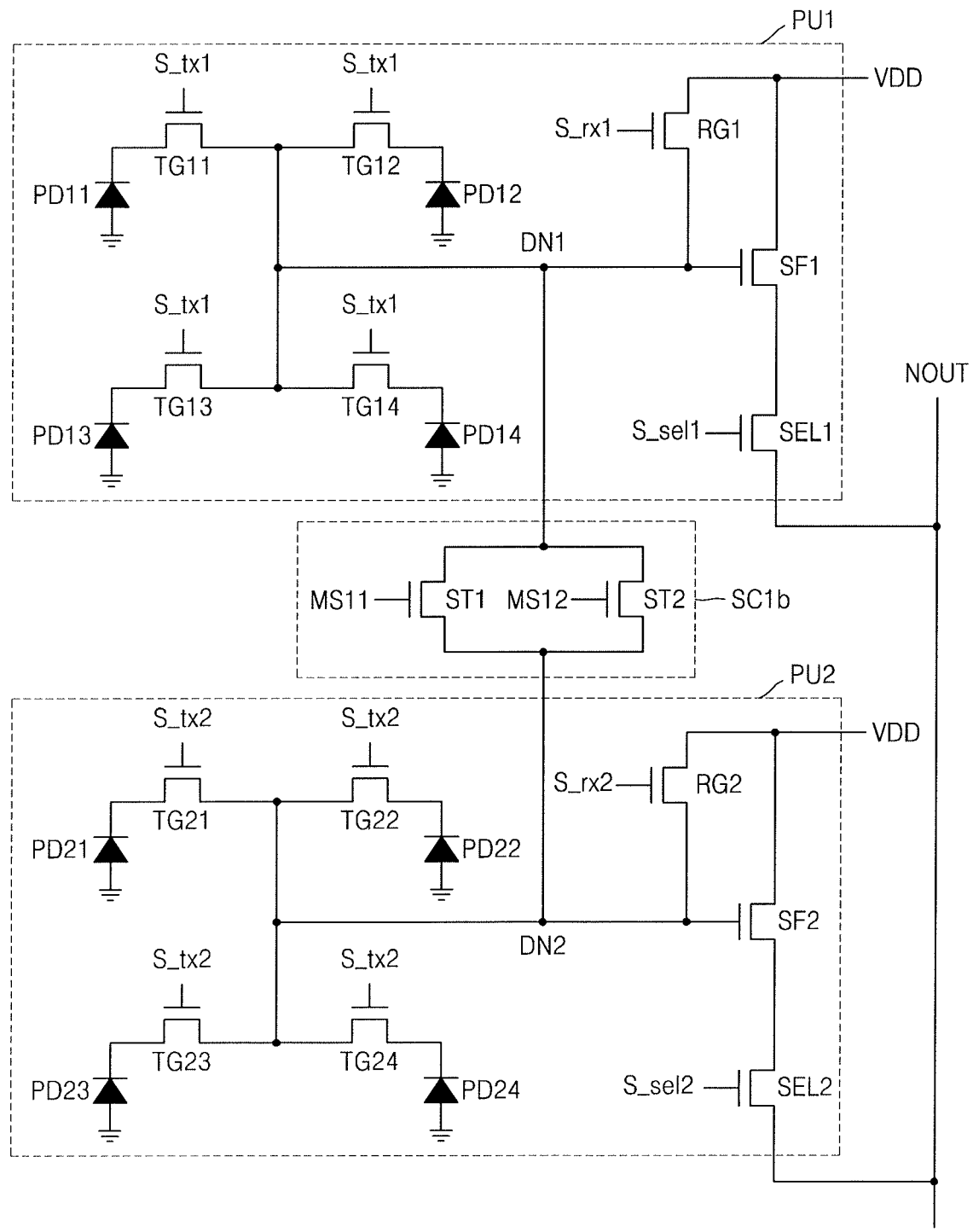
FIG. 7 illustrates a circuit diagram of a unit cell according to an example embodiment.

FIG. 7 is a circuit diagram of a unit cell UCb according to an example embodiment. The same description as given with reference to FIG. 5 will not be repeated.

Referring to FIG. 7, the unit cell UCb may include the first pixel unit PU1, the second pixel unit PU2, and the first switching circuit SC1b. Since the first pixel unit PU1 and the second pixel unit PU2 have been described above with reference to FIG. 5, a description thereof will not be repeated.

The first switching circuit SC1b may include a first switching transistor ST1 and a second switching transistor ST2 connected in parallel. The first switching transistor ST1 and the second switching transistor ST2 may operate independently from each other based on a first mode selection signal MS11 and a second mode selection signal MS12. Since the first switching circuit SC1b includes the first and second switching transistors ST1 and ST2 connected in parallel, an extent to which charges are shared between a first diffusing node DN1 and a second diffusing node DN2 may be adjusted.

In a first mode, both the first switching transistor ST1 and the second switching transistor ST2 may be turned on. Thus, a first pixel signal generated by the first pixel unit PU1 may be equal to a second pixel signal generated by the second pixel unit PU2.

In a second mode, both the first switching transistor ST1 and the second switching transistor ST2 may be turned off. Thus, the first pixel signal generated by the first pixel unit PU1 may be different from the second pixel signal generated by the second pixel unit PU2.

In a third mode, the first switching transistor ST1 may be turned on and the second switching transistor ST2 may be turned off. Thus, only some photocharges of the first diffusing node DN1 may be transmitted to the second diffusing node DN2. As a result, the first pixel signal generated by the first pixel unit PU1 and the second pixel signal generated by the second pixel unit PU2 may be different but may be interpolated with each other. To this end, in an embodiment, the first switching transistor ST1 may include a transistor having a large size, while the second switching transistor ST2 may include a transistor having a small size, i.e., may have a faster switching speed than the first switching transistor ST1.

FIG. 7 illustrates an embodiment in which the first switching circuit SC1b includes two switching transistors (i.e., the first and second switching transistors ST1 and ST2). In an implementation, the first switching circuit SC1b may include three or more switching transistors (e.g., ST1 and ST2). In the implementation in which the first switching circuit SC1b includes three or more switching transistors (e.g., ST1 and ST2), the number of switching transistors (e.g., ST1 and ST2) that are turned on may be determined based on the first and second mode selection signals MS11 and MS12. In an example, a relatively large number of switching transistors may be turned on in a low-luminance environment, while a relatively small number of switching transistors may be turned on in a high-luminance environment.

Figure 8:
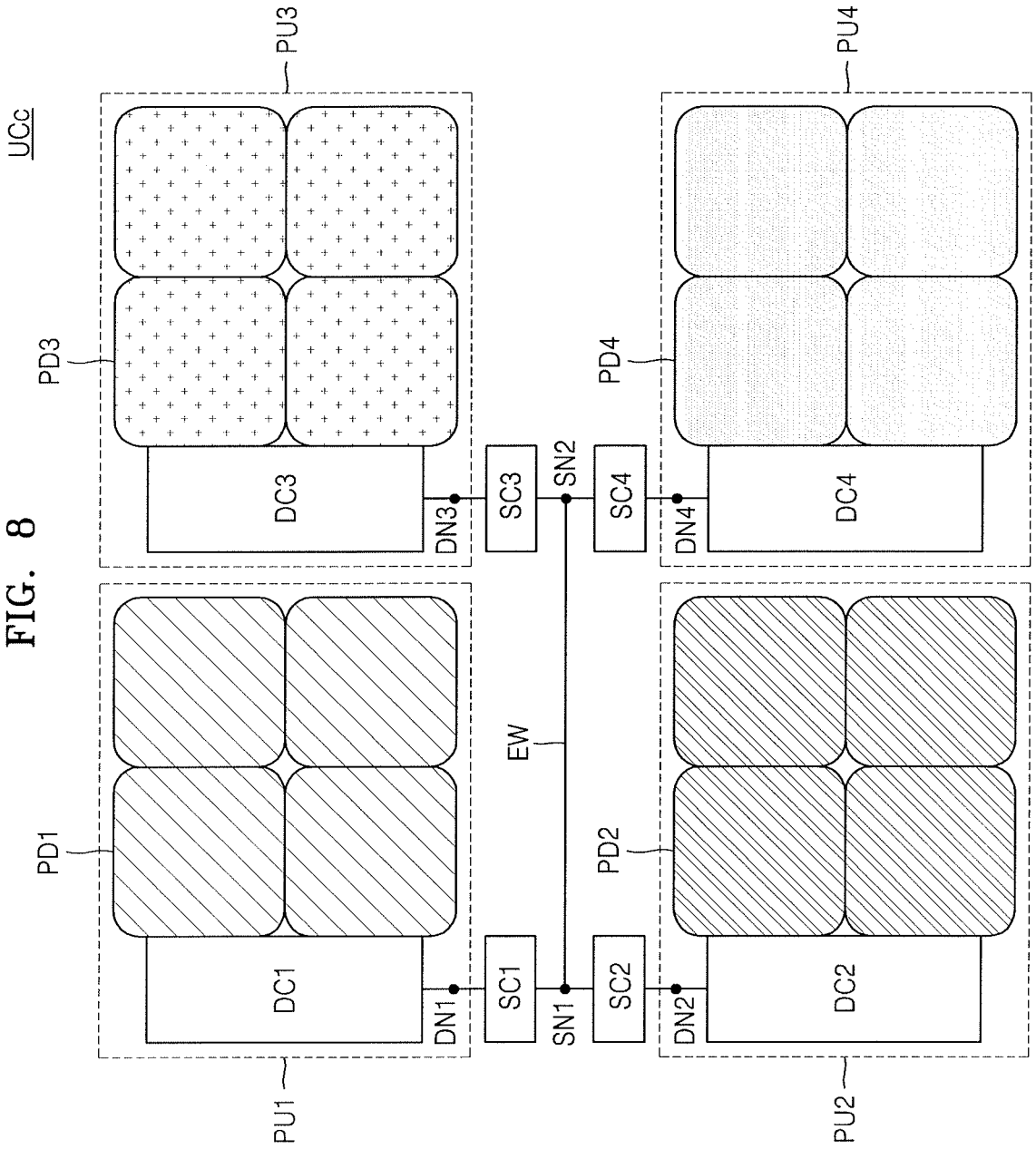
FIG. 8 illustrates a diagram of a unit cell according to an example embodiment.

FIG. 8 is a diagram of a unit cell UCc according to an example embodiment. The same description as given with reference to FIG. 3 will not be repeated. Referring to FIG. 8, the unit cell UCc may include the first pixel unit PU1, the second pixel unit PU2, the third pixel unit PU3, the fourth pixel unit PU4, and a plurality of switching circuits (e.g., SC1 to SC4).

A first switching circuit SC1 may switch between a first sharing node SN1 and the first pixel unit PU1. A second switching circuit SC2 may switch between the first sharing node SN1 and the second pixel unit PU2. A third switching circuit SC3 may switch between a second sharing node SN2 and the third pixel unit PU3. A fourth switching circuit SC4 may switch between the second sharing node SN2 and the fourth pixel unit PU4. In addition, the first sharing node SN1 may be connected to the second sharing node SN2 by a wire EW.

According to an embodiment, the unit cell UC may include the first to fourth switching circuits SC1 to SC4 between the first and second sharing nodes SN1 and SN2 and the first to fourth pixel units PU1 to PU4, and the first and second sharing nodes SN1 and SN2 may be connected to each other by the wire EW. Thus, pixel units that will share photocharges with each other may be variously selected out of the first to fourth pixel units PU1 to PU4.

In an example, the first switching circuit SC1 and the third switching circuit SC3 may be turned on. Thus, the first diffusion node DN1 and the third diffusion node DN3 may be connected to each other and charges may be shared between the first pixel unit PU1 and the third pixel unit PU3, which are adjacent to each other along a horizontal axis, to output one pixel signal.

In an example, the first switching circuit SC1 and the fourth switching circuit SC4 may be turned on. Thus, the first diffusion node DN1 and the fourth diffusion node DN4 may be connected to each other and charges may be shared between the first pixel unit PU1 and the fourth pixel unit PU4, which are adjacent to each other in a diagonal direction, to output one pixel signal.

In an example, the first switching circuit SC1, the third switching circuit SC3, and the fourth switching circuit SC4 may be turned on. Thus, the first diffusion node DN1, the third diffusion node DN3, and the fourth diffusion node DN4 may be connected to each other and charges may be shared among the first, third, and fourth pixel units PU1, PU3, and PU4, to output one pixel signal.

In an example, all of the first to fourth switching circuits SC1, SC2, SC3, and SC4 may be turned on. Thus, the first diffusion node DN1, the second diffusion node DN2, the third diffusion node DN3, and the fourth diffusion node DN4 may be connected to each other and charges may be shared between the first to fourth pixel units PU1, PU2, PU3, and PU4, to output one pixel signal.

Figure 9:
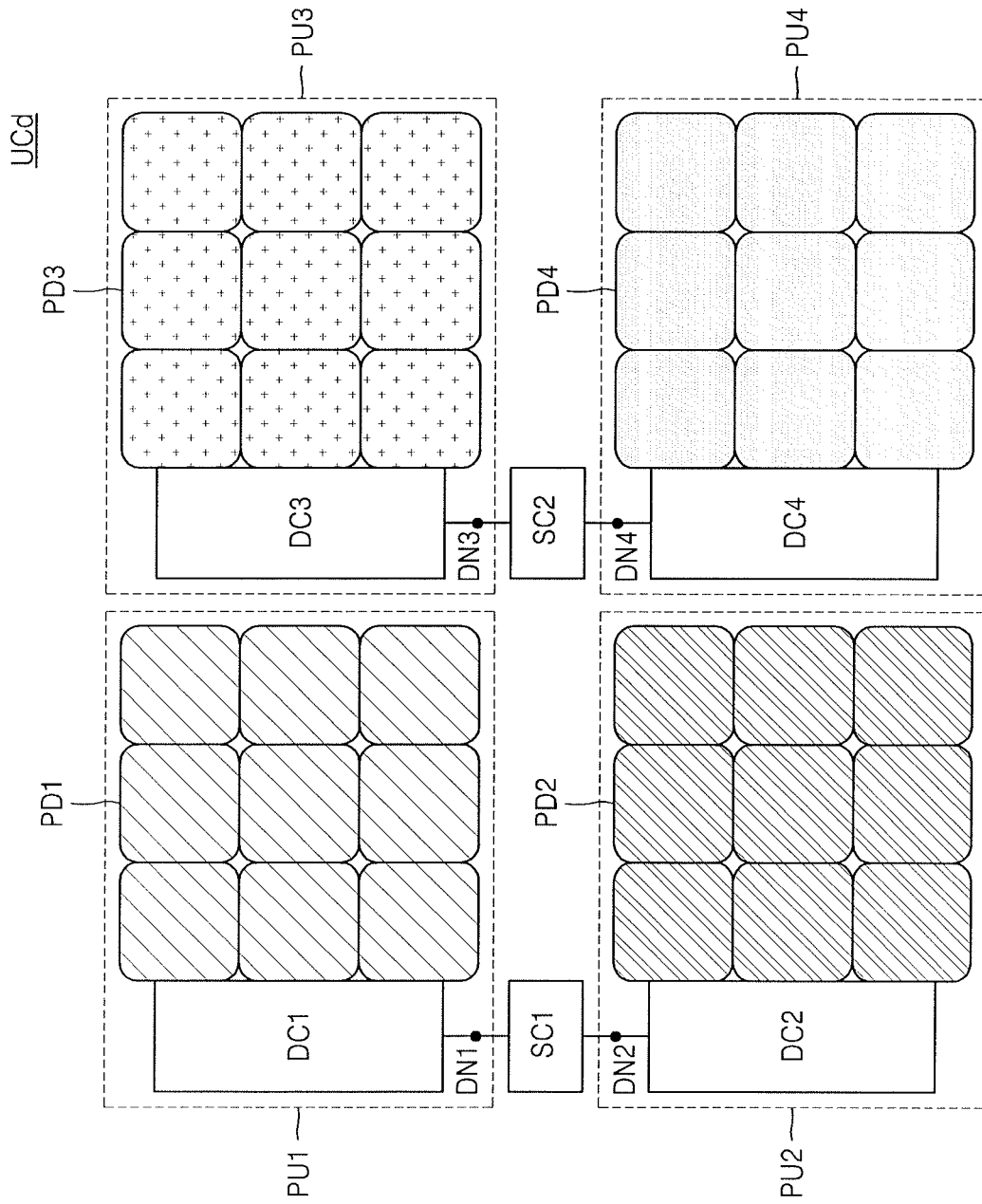
FIG. 9 illustrates a diagram of a unit cell according to an example embodiment.

FIG. 9 is a diagram of a unit cell UCd according to an example embodiment. The same description as given with reference to FIG. 3 will not be repeated.

Referring to FIG. 9, the unit cell UCd may include first to fourth pixel units PU1a to PU4a, the first switching circuit SC1, and the second switching circuit SC2. The first pixel unit PU1a may include nine first photodiodes PD1 and the first driving circuit DC1, which share the first diffusion node DN1 with each other through a transfer transistor. The second pixel unit PU2a may include nine second photodiodes PD2 and a second driving circuit DC2, which share the second diffusion node DN2 with each other through the transfer transistor.

In addition, the third pixel unit PU3a may include nine third photodiodes PD3 and the third driving circuit DC3, which share the third diffusion node DN3 with each other through the transfer transistor. The fourth pixel unit PU4a may include nine fourth photodiodes PD4 and the fourth driving circuit DC4, which share the fourth diffusion node DN4 through the transfer transistor.

In response to a mode selection signal, one pixel signal corresponding to photocharges accumulated by the nine first photodiodes PD1 and the nine second photodiodes PD2 may be output, and one pixel signal corresponding to photocharges accumulated by the nine third photodiodes PD3 and the nine fourth photodiodes PD4 may be output.

Figure 10A:
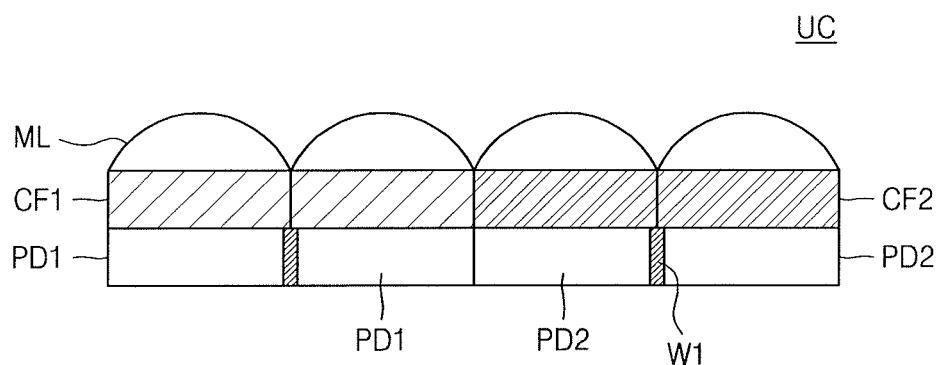
FIG. 10A illustrates a diagram of a unit cell according to an example embodiment.

FIG. 10A is a diagram of a unit cell UC according to an example embodiment. Specifically, FIG. 10A is a lateral sectional view of the unit cell UC.

Referring to FIG. 10A, the unit cell UC may include a plurality of first photodiodes PD1 and a plurality of second photodiodes PD2. A first color filter CF1 in a first color may be stacked on the plurality of first photodiodes PD1 and a second color filter CF2 in a second color may be stacked on the plurality of second photodiodes PD2. A first wall W1 may be between the plurality of first photodiodes PD1 and between the plurality of second photodiodes PD2, and photocharges may not be transported between the first photodiodes PD1 having the first color filter CF1 or between second photodiodes PD2 having the second color filter CF2 due to the first wall W1. The first wall W1 may also be provided between the plurality of first photodiodes PD1 and the plurality of second photodiodes PD2.

Furthermore, a plurality of microlenses ML may be stacked on the first color filter CF1 and the second color filter CF2 to respectively correspond to individual first and second photodiodes PD1 and PD2. The first and second photodiodes PD1 and PD2 may receive a light signal condensed through the microlenses ML corresponding respectively thereto.

Figure 10B:
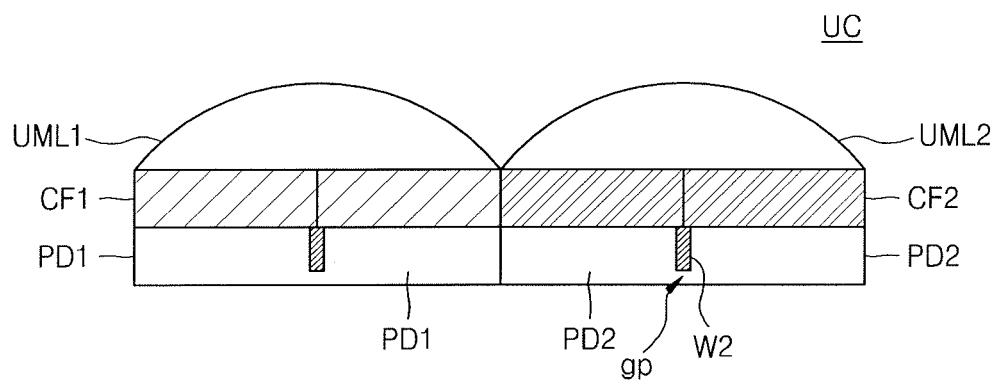
FIG. 10B illustrates a diagram of a unit cell according to an example embodiment.

FIG. 10B is a diagram of a unit cell UC according to an example embodiment. Specifically, FIG. 10B is a lateral sectional view of the unit cell UC. The same description as given with reference to FIG. 11A will be omitted.

Referring to FIG. 10B, a first unit microlens UML1 may be stacked on a first color filter CF1 to entirely cover the plurality of first photodiodes PD1 and a second unit microlens UML2 may be stacked on the second color filter CF2 to entirely cover the plurality of second photodiodes PD2. Also, a second wall W2 having a gap gp may be between the plurality of first photodiodes PD1 and between the plurality of second photodiodes PD2. Photocharges may be transported between the plurality of first photodiodes PD1 through the gap gp formed by the second wall W2. Similarly, photocharges may be transported between the plurality of second photodiodes PD2 through the gap gp formed by the second wall W2. The first wall W1 may also be provided between the plurality of first photodiodes PD1 and the plurality of second photodiodes PD2.

When the first and second photodiodes PD1 and PD2 receive light signals through the first and second unit microlenses UML1 and UML2, the amount of light received by individual first photodiodes PD1 and individual second photodiodes PD2 may not be uniform. Thus, individual first photodiodes PD1 in the plurality of first photodiodes PD1 and individual second photodiodes PD2 of the plurality of second photodiodes PD2 may generate different pixel signals. According to an example embodiment, the gap gp may be formed by the second wall W2, and the photocharges may be transported between individual first photodiodes PD1 in the plurality of first photodiodes PD and individual second photodiodes PD2 of the plurality of second photodiodes PD2 so that a deviation between the pixel signals may be reduced.

Figure 11:
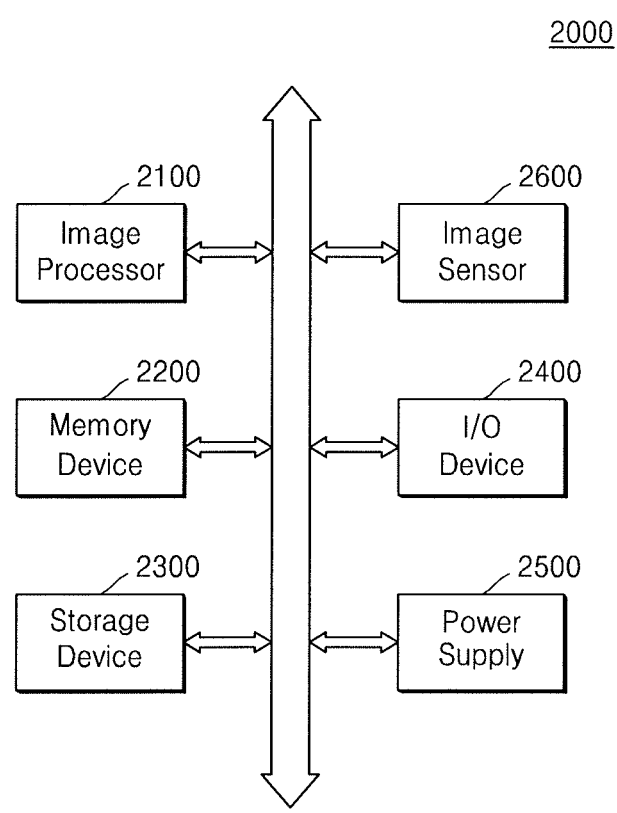
FIG. 11 illustrates a computing system including an image sensor according to an example embodiment.

FIG. 11 illustrates a computing system 2000 including an image sensor 2600 according to an example embodiment. Referring to FIG. 11, the computing system 2000 may include an image processor 2100, a memory device 2200, a storage device 2300, an input/output (I/O) device 2400, a power supply 2500, and the image sensor 2600.

The image sensor 2600 may include the image sensor according to the example embodiment, which is described above with reference to FIGS. 1 to 16. The computing system 2000 may communicate with a video card, a sound card, a memory card, or a universal serial bus (USB) device or further include ports capable of communicating with other electronic devices.

The image processor 2100 may perform specific calculations or tasks. The image processor 2100 may include the image processor according to the example embodiment, which is described above with reference to FIG. 1 to FIG. 11B. For example, the image sensor 2600 may selectively determine the number of photodiodes, which are to obtain pixel data, according to a mode. Accordingly, the image sensor 2600 may adaptively obtain pixel data in different luminance environments.

The memory device 2200 may store data required for an operation of the computing system 2000. For example, the memory device 2200 may be DRAM, mobile DRAM, SRAM, a non-volatile memory device, and the like.

Chips of the memory device 2200 may be mounted individually or together using packages of various types. For example, the chips may be packaged using a Package on Package (PoP) technique, a ball grid array (BGA) technique, a chip-scale package (CSP) technique, a plastic-leaded chip carrier (PLCC) technique, a plastic dual in-line package (PDIP) technique, a die-in-waffle-pack technique, a die-in-wafer-form technique, a chip-on-board (COB) technique, a ceramic dual in-line package (CERDIP) technique, a plastic metric quad flat-pack (MQFP) technique, and the like.

The storage device 2300 may include a solid-state drive (SSD), a hard disk drive (HDD), compact disc read-only memory (CD-ROM), and the like. The I/O device 2400 may include an input unit, e.g., as a keyboard, a keypad, a mouse, and the like, and output units, e.g. a printer, a display, and the like. The power supply 2500 may supply an operating voltage required for the operation of the computing system 2000.

The image sensor 2600 may be connected to the image processor 2100 through buses or other communication links and perform communication operations. According to the example embodiments, when the image sensor 2600 receives zoom information regarding a digital zoom from the image processor 2100, the image sensor 2600 may adjust a row processing time RPT based on the zoom information. Thus, the image sensor 2600 according to the example embodiment may reduce noise caused by the digital zoom and reduce power consumed by the image sensor. The image sensor 2600 and the image processor 2100 may be integrated together in one chip or integrated in respectively different chips. The computing system 2000 may be interpreted as any computing system using an image sensor. The computing system 2000 may be interpreted as any computing system using an image sensor. For example, the computing system 2000 may include a digital camera, a mobile phone, a personal digital assistant (PDA), a portable multimedia player (PMP), a smartphone, and/or a tablet personal computer (PC).

By way of summation and review, one or more embodiments may provide an image sensor to obtain pixel data from a different number of photodiodes according to a mode and a light sensing circuit to obtain pixel data from a different number of photodiodes depending on a mode.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
    a first pixel unit including a plurality of first photodiodes and a first driving circuit to generate a first pixel signal based on an amount of charges stored in the plurality of first photodiodes;
    a second pixel unit including a plurality of second photodiodes and a second driving circuit to generate a second pixel signal based on an amount of charges stored in the plurality of second photodiodes; and
    a switching circuit connected to the first driving circuit through a first diffusion node and connected to the second driving circuit through a second diffusion node, the switching circuit to connect or disconnect the first diffusion node and the second diffusion node based on a mode selection signal, wherein the switching circuit:
    connects the first diffusion node to the second diffusion node in a first mode based on the mode selection signal to drive the first pixel unit and the second pixel unit simultaneously, and
    disconnects the first diffusion node from the second diffusion node in a second mode to drive the first pixel unit and the second pixel unit independently.

2. The image sensor as claimed in claim 1, wherein the first mode has a lower resolution than the second mode.

3. The image sensor as claimed in claim 1, wherein the switching circuit includes one switching transistor between the first diffusion node and the second diffusion node.

4. The image sensor as claimed in claim 1, wherein
    the switching circuit includes a plurality of switching transistors between the first diffusion node and the second diffusion node, and
    the plurality of switching transistors are selectively turned on based on the mode selection signal.

5. The image sensor as claimed in claim 4, wherein the plurality of switching transistors are connected in series.

6. The image sensor as claimed in claim 4, wherein the plurality of switching transistors are connected in parallel.

7. The image sensor as claimed in claim 1, wherein the first pixel unit includes four first photodiodes arranged in two rows and two columns.

8. The image sensor as claimed in claim 1, wherein the first pixel unit includes nine first photodiodes arranged in three rows and three columns.

9. The image sensor as claimed in claim 1, further comprising:
    a third pixel unit including a plurality of third photodiodes and a third driving circuit to generate a third pixel signal based on an amount of charges stored in the plurality of third photodiodes; and
    a fourth pixel unit including a plurality of fourth photodiodes and a fourth driving circuit to generate a fourth pixel signal based on an amount of charges stored in the plurality of fourth photodiodes,
    wherein the switching circuit includes:
        a first switch connected to the first driving circuit through the first diffusion node,
        a second switch connected to the second driving circuit through the second diffusion node,
        a third switch connected to the third driving circuit through a third diffusion node, and
        a fourth switch connected to the fourth driving circuit through a fourth diffusion node.

10. The image sensor as claimed in claim 1, wherein
    all of the plurality of first photodiodes include a color filter in a first color,
    all of the plurality of second photodiodes include a color filter in a second color, and
    the first color is different from the second color.

11. The image sensor as claimed in claim 1, wherein
    the first pixel unit further includes a plurality of microlenses corresponding to respective ones of the plurality of first photodiodes, respectively, and
    each of the plurality of first photodiodes receives optical information through the microlens corresponding thereto.

12. The image sensor as claimed in claim 1, wherein
    the first pixel unit further includes one unit microlens for the plurality of first photodiodes, and
    the plurality of first photodiodes receive optical information through the unit microlens.

13. The image sensor as claimed in claim 12, wherein the plurality of first photodiodes share at least some photocharges with each other.

14. A light sensing circuit, comprising:
    a plurality of first photodiodes to store charges based on optical information received through a first color filter in a first color;
    a first driving circuit to change a voltage of a first diffusion node based on an amount of charges stored in the plurality of first photodiodes;
    a plurality of second photodiodes to store charges based on optical information received through a second color filter in a second color;

a second driving circuit to change a voltage of a second diffusion node based on an amount of charges stored in the plurality of second photodiodes; and a switching circuit to connect or disconnect the first diffusion node and the second diffusion node based on a mode selection signal, wherein the switching circuit includes a plurality of switching transistors connected between the first diffusion node and the second diffusion node, the plurality of switching transistors having gates to which the mode selection signal is applied.

15. The light sensing circuit as claimed in claim 14, wherein the plurality of switching transistors are connected in series.

16. The light sensing circuit as claimed in claim 14, wherein the first driving circuit includes:

a plurality of first transfer transistors respectively connected between the plurality of first photodiodes and the first diffusion node, the plurality of first transfer transistors to respectively switch between the plurality of first photodiodes and the first diffusion node based on a transfer control signal;

a first reset transistor connected between the first diffusion node and a power supply voltage node, the first reset transistor to reset the first diffusion node to a power supply voltage based on a reset control signal;

a first driving transistor to generate a pixel signal based on a voltage of the first diffusion node; and a first selection transistor to output the pixel signal generated by the first driving transistor to an output node based on a selection control signal.

17. An image sensor, comprising:

a first pixel unit including a plurality of first photodiodes to receive light through a first color filter of a first color, the plurality of first photodiodes being coupled to a first diffusion node;

a second pixel unit including a plurality of second photodiodes to receive light through a second color filter of a second color, different from the first color, the plurality of second photodiodes being coupled to a second diffusion node;

a first unit microlens on the first pixel unit; and a second unit microlens on the second pixel unit, wherein the plurality of first photodiodes share at least some of charges stored therein with the plurality of second photodiodes by a selective connection that connects the first diffusion node to the second diffusion node in a first mode based on a mode selection signal to drive the first pixel unit and the second pixel unit simultaneously, and disconnects the first diffusion node from the second diffusion node in a second mode to drive the first pixel unit and the second pixel unit independently.

* * * * *